United States Patent
Lee et al.

(10) Patent No.: US 12,342,649 B2
(45) Date of Patent: Jun. 24, 2025

(54) IMAGE SENSOR INCLUDING META PATTERN LAYER HAVING LIGHT RESONANCE FUNCTION

(71) Applicant: SAMSUNG ELECTRONICS CO., LTD., Suwon-si (KR)

(72) Inventors: Junho Lee, Incheon (KR); Sangeun Mun, Seoul (KR); Sookyoung Roh, Yongin-si (KR); Sungmo Ahn, Yongin-si (KR); Seokho Yun, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 470 days.

(21) Appl. No.: 17/841,777

(22) Filed: Jun. 16, 2022

(65) Prior Publication Data

US 2023/0031010 A1    Feb. 2, 2023

(30) Foreign Application Priority Data

Jul. 30, 2021 (KR) .................. 10-2021-0101018

(51) Int. Cl.
*H10F 39/00* (2025.01)
*G02B 1/00* (2006.01)
*H10F 39/18* (2025.01)

(52) U.S. Cl.
CPC .......... *H10F 39/806* (2025.01); *G02B 1/002* (2013.01); *H10F 39/182* (2025.01)

(58) Field of Classification Search
CPC ... G02B 1/002; G02B 13/16; H01L 27/14625; H01L 27/14645
See application file for complete search history.

(56) References Cited

U.S. PATENT DOCUMENTS

| | | | |
|---|---|---|---|
| 6,861,280 B2 | 3/2005 | Yamamoto | |
| 9,159,761 B2 | 10/2015 | Kokubun | |
| 10,739,188 B2 * | 8/2020 | Nam | ............... H10F 39/024 |
| 2004/0080008 A1 | 4/2004 | Yamamoto | |

(Continued)

FOREIGN PATENT DOCUMENTS

| | | |
|---|---|---|
| JP | 2015-087431 A | 5/2015 |
| KR | 10-2016-0064922 A | 6/2016 |

(Continued)

OTHER PUBLICATIONS

Liu et al., "Dielectric Resonance-Based Optical Metasurfaces: From Fundamentals to Applications," iScience vol. 23, No. 101868, Dec. 18, 2020, Total 23 pages.

(Continued)

*Primary Examiner* — Amy R Hsu
(74) *Attorney, Agent, or Firm* — Sughrue Mion, PLLC

(57) ABSTRACT

Provided is an image sensor including a metasurface having a light resonance function. The image sensor includes a photoelectric conversion layer, an interlayer material layer on the photoelectric conversion layer, and a single meta pattern layer on the interlayer material layer, wherein the meta pattern layer includes a metasurface, the metasurface having a same phase profile as that of a lens, and the meta pattern layer has a height that causes a resonance at a given wavelength of incident light to block transmission of the given wavelength through the meta pattern layer.

21 Claims, 13 Drawing Sheets

(56) References Cited

U.S. PATENT DOCUMENTS

| | | |
|---|---|---|
| 2016/0156883 A1 | 6/2016 | Han et al. |
| 2018/0172988 A1* | 6/2018 | Ahmed .................. G06T 11/00 |
| 2019/0025464 A1* | 1/2019 | Czaplewski ............. G02B 3/08 |
| 2019/0075275 A1* | 3/2019 | Lee ........................ H04N 9/315 |
| 2019/0196068 A1* | 6/2019 | Tsai ........................ G02B 1/002 |
| 2021/0044748 A1* | 2/2021 | Hu ..................... G02B 27/0172 |
| 2021/0126029 A1 | 4/2021 | Roh et al. |
| 2021/0126035 A1 | 4/2021 | Roh et al. |
| 2022/0004732 A1* | 1/2022 | Hsieh ................... H10F 39/024 |

FOREIGN PATENT DOCUMENTS

| | | |
|---|---|---|
| KR | 10-2017-0105877 A | 9/2017 |
| KR | 10-2019-0026434 A | 3/2019 |
| KR | 10-2143535 B1 | 8/2020 |
| KR | 10-2021-0048401 A | 5/2021 |
| KR | 10-2021-0048985 A | 5/2021 |

OTHER PUBLICATIONS

Communication dated Dec. 5, 2022, issued by the Korean Intellectual Property Office in Korean Patent Application No. 10-2021-0101018.

* cited by examiner

RESONANCE OFF

RESONANCE ON

IMAGE SENSOR INCLUDING META PATTERN LAYER HAVING LIGHT RESONANCE FUNCTION

CROSS-REFERENCE TO RELATED APPLICATION

This application is based on and claims priority under 35 U.S.C. Korean Patent Application No. 10-2021-0101018, filed on Jul. 30, 2021, in the Korean Intellectual Property Office, the disclosure of which is herein incorporated by reference in its entirety.

BACKGROUND

1. Field

The disclosure relates to an image sensor, and more particularly, to an image sensor including a meta pattern layer having a light resonance function.

2. Description of the Related Art

An image sensor generally includes a microlens array for collecting light, a planarized layer, an organic color filter for color filtering, and a photodiode. The microlens array and the organic color filter are independently provided. The microlens array and the organic color filter are provided as individual layers for collecting and color filtering, respectively, and a light path needs to be secured.

SUMMARY

One or more example embodiments provide an image sensor having a simplified configuration.

One or more example embodiments provide an image sensor that is stable and has an improved degree of integration.

Additional aspects will be set forth in part in the description which follows and, in part, will be apparent from the description, or may be learned by practice of the presented embodiments of the disclosure.

According to an aspect of an example embodiment, provided is an image sensor including: a photoelectric conversion layer; an interlayer material layer on the photoelectric conversion layer; and a single meta pattern layer on the interlayer material layer, wherein the meta pattern layer includes a metasurface, the metasurface having a same phase profile as that of a lens, and the meta pattern layer has a height that causes a resonance at a given wavelength of incident light to block transmission of the given wavelength through the meta pattern layer.

The metasurface may include a plurality of meta patterns, each having a shape of a concentric circle or a shape similar to the concentric circle.

The plurality of meta patterns may have a same height as each other.

At least two meta patterns of the plurality of meta patterns may contact each other in a diagonal direction.

A meta pattern at a center of the plurality of meta patterns may have a rectangular planar shape.

Each of the plurality of meta patterns may include a plurality of unit meta patterns.

Each of the plurality of unit meta patterns may be a nanorod and have a circular shape or a non-circular planar shape.

The nanorod may be a single-walled cylinder or a double-walled cylinder.

The plurality of meta patterns may be respectively arranged in concentric circles, separated from each other, and have different heights from each other.

A meta pattern at a center of the concentric circle among the plurality of meta patterns may be circular and have a height that causes the resonance.

The heights of the plurality of meta patterns may decrease from a center toward an outside of the concentric circle.

Among the plurality of meta patterns, a height of a meta pattern at a center of the concentric circle may be less than a height of an adjacent meta pattern.

The plurality of meta patterns may be arranged such that a height of a meta pattern at a center of the concentric circle and a height of a meta pattern at an outermost side are different from each other.

The plurality of meta patterns may be arranged at distances that cause the resonance at a corresponding wavelength in a radial direction.

The plurality of meta patterns may be arranged such that a distance between a meta pattern located at an outermost side and a meta pattern adjacent thereto is greatest among the distances between the plurality of meta patterns.

Each of the plurality of meta patterns may have a thickness that causes the resonance at a corresponding wavelength in a radial direction.

A meta pattern located at an outermost side may have a greatest thickness among the plurality of meta patterns.

The photoelectric conversion layer may include: a first photoelectric conversion layer belonging to a first sub-pixel; a second photoelectric conversion layer belonging to a second sub-pixel; and a third photoelectric conversion layer belonging to a third sub-pixel.

The meta pattern layer may include: a first meta pattern layer corresponding to the first photoelectric conversion layer and having a first height that causes the resonance to block transmission of a first wavelength of the incident light; a second meta pattern layer corresponding to the second photoelectric conversion layer and having a second height that causes the resonance to block transmission of a second wavelength of the incident light; and a third meta pattern layer corresponding to the third photoelectric conversion layer and having a third height that causes the resonance to block transmission of a third wavelength of the incident light.

The meta pattern layer may have a resonance wavelength ($\lambda$) at a center, represented by the following equation: $\lambda=557.62 \times h^{0.5642}$ (h is the height of the meta pattern layer), and the resonance may occur with respect to the given wavelength corresponding to the resonance wavelength at the center.

Each of the plurality of meta patterns may have a thickness that causes the resonance at a corresponding wavelength in a radial direction.

According to an aspect of an example embodiment, provided is an image sensor including: a photoelectric conversion layer; a plurality of base layers that are transparent and sequentially stacked on the photoelectric conversion layer; and a plurality of metasurfaces stacked on the photoelectric conversion layer, wherein the plurality of metasurfaces are arranged between the plurality of base layers, respectively; the plurality of metasurfaces include a plurality of meta patterns and have a same phase profile as that of a lens; the plurality of metasurfaces have dimensions that respectively cause a resonance at a given wavelength of incident light to block transmission of the given wavelength;

and wavelengths that cause the resonance of the plurality of metasurfaces are different from each other.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
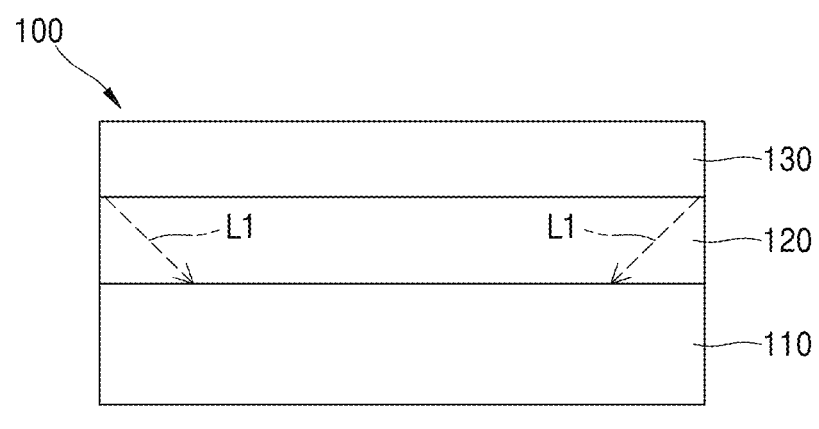
FIG. 1 is a cross-sectional view of a sub-pixel of an image sensor including a meta pattern layer having a light resonance function, according to an example embodiment.
Figure 1:
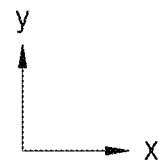

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a meta pattern layer having a light resonance function according to an example embodiment will be described in detail with reference to the accompanying drawings. A manufacturing method of the image sensor will be described together in the process of describing the layer structure. In this process, in the drawings, thicknesses of layers and regions may be exaggerated for clarity of specification. Also, the embodiments described below are merely illustrative, and are capable of various modifications. In the layer structure described below, when an element is referred to as being "on" or "above" another element, the element may be in direct contact with the other element or other intervening elements may be present. In the drawings, like reference numerals refer to the like elements.

FIG. 1 shows a sub-pixel of an image sensor including a meta pattern layer having a light resonance function according to an example embodiment.

Referring to FIG. 1, a sub-pixel 100 may include a photoelectric conversion layer 110, a transparent interlayer material layer 120, and a multifunctional meta pattern layer 130. In an example, the photoelectric conversion layer 110 may include a photoelectric conversion element for converting light incident through the meta pattern layer 130 and the interlayer material layer 120 to a current. In an example, the photoelectric conversion element may include a photodiode. In an example, the interlayer material layer 120 may include a material layer that is transparent to light incident through the meta pattern layer 130 and does not absorb or substantially does not absorb light. "Not substantially absorbing" means that a light absorption rate is 10% or less, for example, 5% or less. In an example, the material layer may include a siloxane-based spin on glass (SOG), a transparent polymer, and a silicon oxide (e.g., $SiO_2$). In an example, the material layer may be an air layer.

The meta pattern layer 130 may include a metasurface formed on the interlayer material layer 120. The metasurface may include a plurality of meta patterns. The size of each meta pattern may be less than the wavelength of incident light. In an example, the size of each meta pattern may be ½ or less of the wavelength of incident light. The metasurface of the meta pattern layer 130 may be designed to have various functions. In an example, the meta pattern layer 130 may include a metasurface designed to perform as a metalens. This will be described in detail later. Because the meta pattern layer 130 serves as a metalens, light incident on the meta pattern layer 130 may be condensed onto the photoelectric conversion layer 110. A thickness of the interlayer material layer 120 may vary depending on a focal length of the meta pattern layer 130 serving as a metalens. In an example, the meta pattern layer 130 may also cause resonance at a certain wavelength and block the certain wavelength, in addition to serving as a metalens. In other words, the metasurface included in the meta pattern layer 130 may be designed to cause a blocking resonance to a certain wavelength. Most of the light causing resonance among light incident on the meta pattern layer 130 may be scattered during resonance and some of the light may be absorbed. As a result, light causing resonance among light incident on the meta pattern layer 130 may not be transmitted through the meta pattern layer 130 and be blocked. In this regard, the resonance occurring in the meta pattern layer 130 may be regarded as a transmission blocking resonance.

In an example, the certain wavelength may belong to a visible light region, and the meta pattern layer 130 may serve as a color filter for filtering (blocking) a color of the certain wavelength in the visible light region. Therefore, in accordance with a form of the metasurface included in the meta pattern layer 130, the unit sub-pixel 100 may be used as a sub-pixel for a first wavelength, a sub-pixel for a second wavelength, or a sub-pixel of a third wavelength of the visible light region. The first to third wavelengths may be different wavelengths from each other. In an example, among the first wavelength to the third wavelength, the first wavelength may correspond to cyan, the second wavelength may correspond to magenta, and the third wavelength may correspond to yellow.

Figure 2:
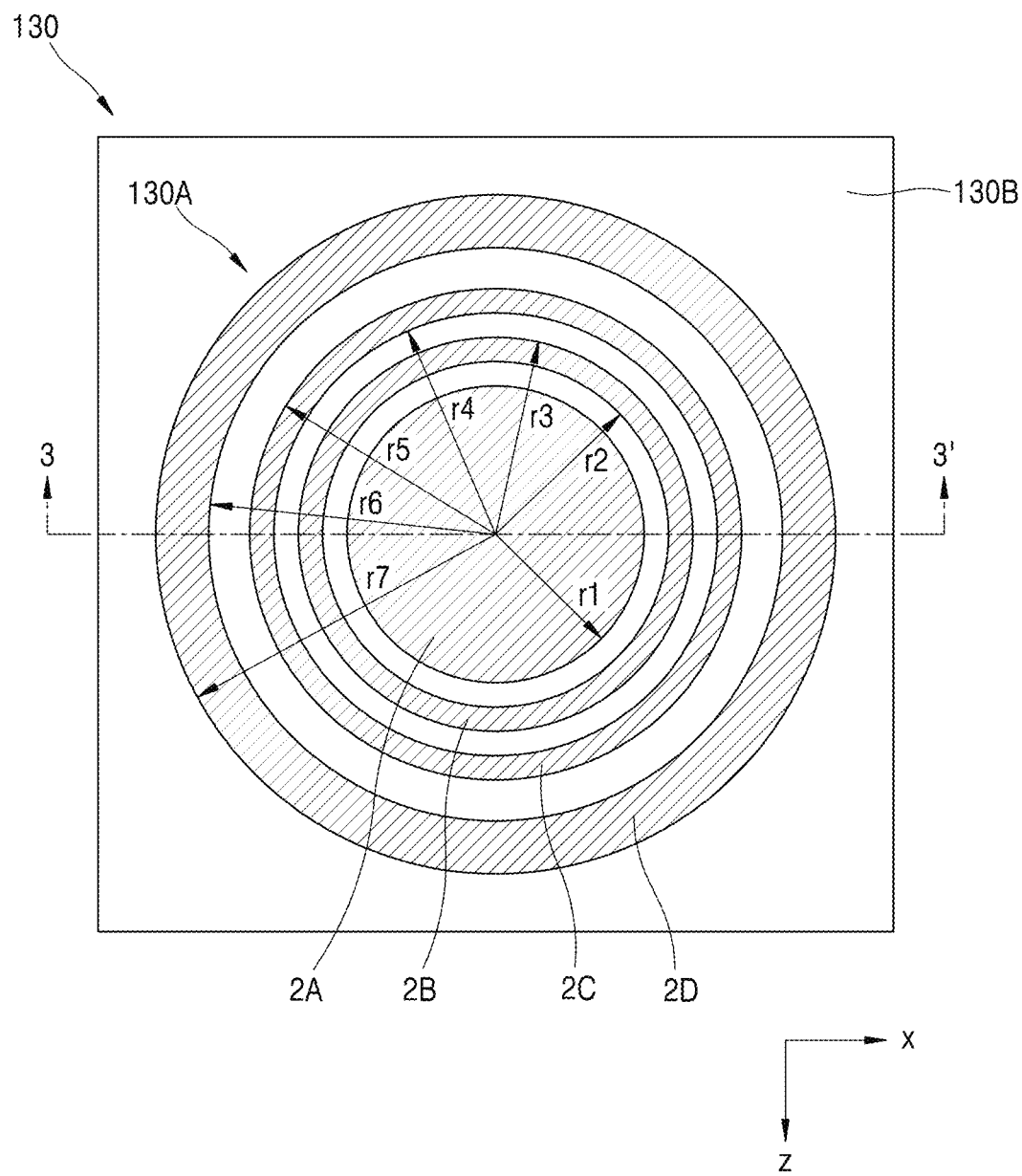
FIG. 2 is a plan view of the meta pattern layer of FIG. 1.

FIG. 2 is a plan view of the meta pattern layer 130 of FIG. 1.

Referring to FIG. 2, the meta pattern layer 130 may include a metasurface 130A and a low refractive index layer 130B. The low refractive index layer 130B may be transparent to light incident on the meta pattern layer 130. A refractive index of the low refractive index layer 130B may be less than that of a material forming the metasurface 130A, that is, a meta material. The low refractive index layer 130B may be arranged to completely surround the metasurface 130A. In an example, the low refractive index layer 130B may be an inorganic material layer, and may include, for example, a SOG or a silicon oxide. In an example, the low refractive index layer 130B may be an air layer. The metasurface 130A may include a plurality of meta patterns 2A, 2B, 2C, and 2D (hereinafter, also referred to as a first meta pattern 2A, a second meta pattern 2B, a third meta pattern 2C, a fourth meta pattern 2D, or remaining plurality of meta patterns 2B, 2C, and 2D), but is not limited thereto. The plurality of meta patterns 2A, 2B, 2C, and 2D may be formed of an inorganic material having a high refractive index greater than the refractive index of the low refractive index layer 130B. In an example, the inorganic material may include $TiO_2$, $SiN_x$, or GaP. The plurality of meta patterns 2A, 2B, 2C, and 2D may be separated from each other. In an example, the first meta pattern 2A may be circular and have a first radius r1, but is not limited thereto. In an example, the first radius r1 may be about 50 nm to about 200 nm. The first meta pattern 2A may be at a center of the metasurface 130A. A center of the plurality of meta patterns 2A, 2B, 2C, and 2D may be a center of the first meta pattern 2A. The remaining plurality of meta patterns 2B, 2C, and 2D excluding the first meta pattern 2A may be arranged to form a concentric circle around the first meta pattern 2A. While it is illustrated that each of the plurality of meta patterns 2A, 2B, 2C, and 2D may be of a concentric circle, an embodiment is not limited thereto and the plurality of meta patterns 2A, 2B, 2C, and 2D may form a shape similar to the concentric circle (e.g., a concentric oval). The term "shape similar to the concentric circle" may refer to any shape that has a similarity to the concentric circle at a predetermined degree or greater (e.g., 80% or greater).

Because the plurality of meta patterns 2A, 2B, 2C, and 2D form such a shape, the metasurface 130A may have the same phase profile as that of a lens, and as a result, the meta pattern layer 130 may serve as a metalens (e.g., a converging lens). As a result, light passed through the metasurface 130A, that is, light passed through the meta pattern layer 130, may be condensed onto the photoelectric conversion layer 110 in the focal length of the meta pattern layer 130.

The second meta pattern 2B may be provided to completely surround the first meta pattern 2A. The second meta pattern 2B may be provided in the shape of a ring having a second radius r2 as an inner diameter and a third radius r3 as an outer diameter, but is not limited thereto. In an example, when the shape of the first meta pattern 2A is non-circular, the second meta pattern 2B may have a ring shape resembling the first meta pattern 2A. The second radius r2 of the second meta pattern 2B may be greater than the first radius r1 of the first meta pattern 2A. A difference r2−r1 between the second radius r2 and the first radius r1 may be a first separation distance between the first meta pattern 2A and the second meta pattern 2B. A difference r3−r2 between the third radius r3 and the second radius r2 of the second meta pattern 2B may be a thickness of the second meta pattern 2B in the radial direction thereof. A first thickness r3−r2 in the radial direction of the second meta pattern 2B may be smaller than the first radius r1 of the first meta pattern 2A. In an example, the first thickness r3−r2 in the radial direction of the second meta pattern 2B and the first separation distance r2−r1 between the first meta pattern 2A and the second meta pattern 2B may be identical to or different from each other. For example, the first thickness r3−r2 of the second meta pattern 2B may be greater or smaller than the first separation distance r2−r1 between the first and second meta patterns 2A and 2B. A third meta pattern 2C may be disposed in a shape to completely surround the first meta pattern 2A and the second meta pattern 2B. In an example, the third meta pattern 2C may have a ring shape having a fourth radius r4 as an inner diameter and a fifth radius r5 as an outer diameter. In an example, when the shape of the first meta pattern 2A is non-circular, as in the second meta pattern 2B, the third meta pattern 2C may have a ring shape resembling the first meta pattern 2A. The fourth radius r4 and the fifth radius r5 of the third meta pattern 2C may be greater than the first to third radiuses r1, r2, and r3. The difference r4−r3 between the fourth radius r4 of the third meta pattern 2C and the third radius r3 of the second meta pattern 2B may be a second separation distance between the third meta pattern 2C and the second meta pattern 2B. The second separation distance r4−r3 and the first separation distance r2−r1 may be identical to or different from each other. In an example, the second separation distance r4−r3 may be greater or smaller than the first separation distance r2−r1. In an example, the second separation distance r4−r3 may be smaller than the first radius r1 of the first meta pattern 2A. In an example, the second separation distance r4−r3 may be identical to or different from the first thickness r3−r2. A difference r5−r4 between the fifth radius r5 and the fourth radius r4 of the third meta pattern 2C may be a thickness in the radial direction of the third meta pattern 2C. In an example, a second thickness r5−r4 of the third meta pattern 2C may be smaller than the first radius r1. In an example, the second thickness r5−r4 may be identical to or different from the first thickness r3−r2. In an example, the second thickness r5−r4 may be identical to or different from the second separation distance r4−r3. In an example, the second thickness r5−r4 may be identical to or different from the first separation distance r2−r1. The fourth meta pattern 2D may be arranged to completely surround the first to third meta patterns 2A to 2C. The shape of the fourth meta pattern 2D may be in the form of a ring having an inner diameter of a sixth radius r6 and an outer diameter of a seventh radius r7. A difference r6−r5 between the sixth radius r6 and the fifth radius r5 may be a third separation distance between the third meta pattern 2C and the fourth meta pattern 2D. The third separation distance r6−r5 may be greater than the first separation distance r2−r1 and the second separation distance r4−r3, and vice versa. In an example, the third separation distance r6−r5 may be or not be less than the first radius r1. In an example, the third separation distance r6−r5 may be greater than or not be greater than the first thickness r3−r2 and the second thickness r5−r4. In an example, the third separation distance r6−r5 may be less than at least one of the first thickness r3−r2 and the second thickness r5−r4. A difference r7−r6 between the seventh radius r7 and the sixth radius r6 of the fourth meta pattern 2D may be a thickness in the radial direction of the fourth meta pattern 2D. A third thickness r7−r6 of the fourth meta pattern 2D may be greater than the first thickness r3−r2 and the second thickness r5−r4, and vice versa. In an example, the third thickness r7−r6 may be greater than or may not be greater than the first to third separation distances r2−r1, r4−r3, and r6−r5 For example, the third thickness r7−r6 may be less than at least one of the first to third separation distances r2−r1, r4−r3, and r6−r5.

Although the metasurface 130A is illustrated to include four meta patterns 2A, 2B, 2C, and 2D, this is for convenience of explanation, and the metasurface 130A may include four or more, or four meta patterns or less.

Figure 3:
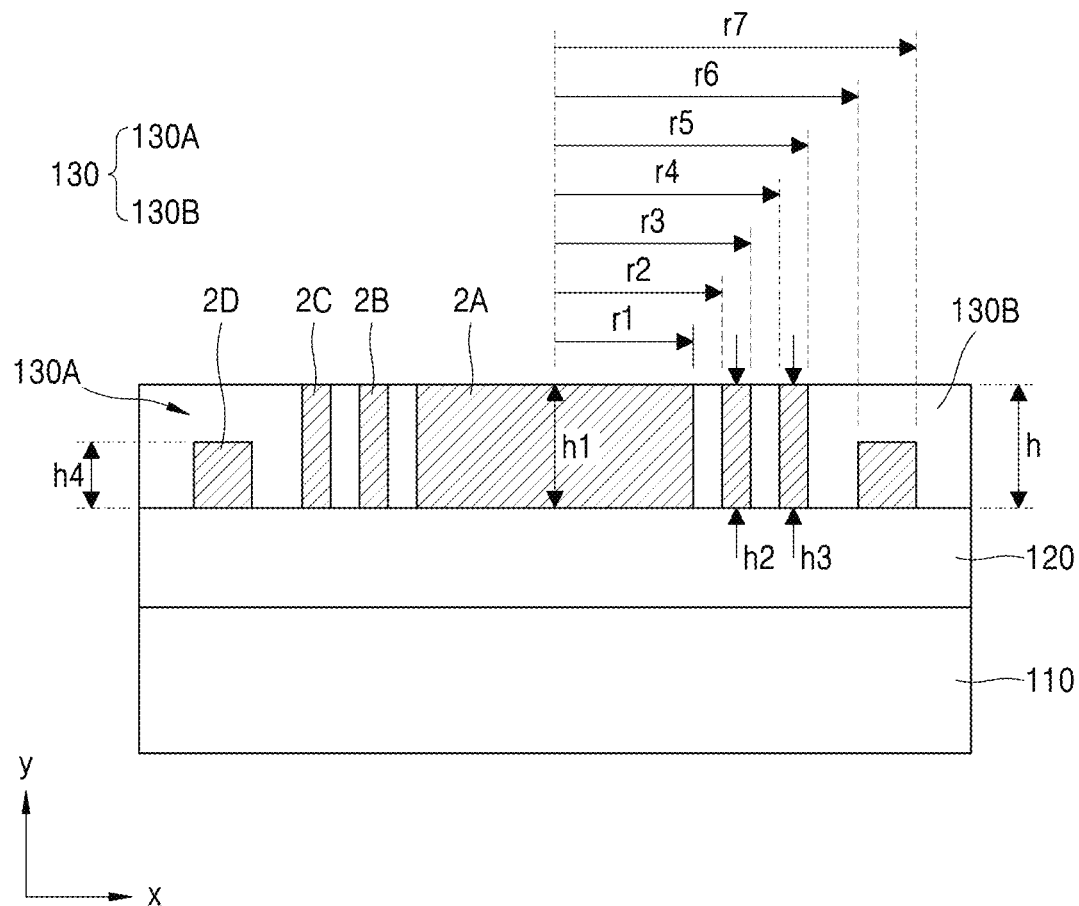
FIG. 3 is a cross-sectional view taken along line 3-3' in FIG. 2.

FIG. 3 shows a cross-sectional view taken along line 3-3' of FIG. 2.

Referring to FIG. 3, the first meta pattern 2A may have a first height h1 in a direction perpendicular to the upper surface of the interlayer material layer 120. The first height h1 of the first meta pattern 2A, which is highest at the center, may represent the height of the metasurface 130A. The first height h1 may be identical to or different from the first radius r1. The second meta pattern 2B may have a second height h2 in the same direction as the first height h1. The third meta pattern 2C may have a third height h3 in the same direction as the first height h1. The fourth meta pattern 2D may have a fourth height h4 in the same direction as the first height h1. In an example, the first to third heights h1, h2, and h3 may be the same from each other, but may not be the same from each other, as described below. In an example, the fourth height h4 may be less than or not be less than the first to third heights h1, h2, and h3. The height of the low refractive index layer 130B may be the same as the height of the first to third meta patterns 2A, 2B, and 2C. In the case of FIG. 3, the height h1 of the first meta pattern 2A, which is the highest among the meta patterns 2A, 2B, 2C, and 2D included in the metasurface 130A, may be the same as the height h of the meta pattern layer 130. When the height of the meta pattern layer 130 or the height of the metasurface 130A decreases or increases to a certain amount, the height of each of the meta patterns 2A, 2B, 2C, and 2D included in the metasurface 130A may also decrease or increase in the same proportion. The same applies to other dimensions (e.g., separation distance, thickness, etc.) of each of the meta patterns 2A, 2B, 2C, and 2D. Thus, the meta patterns 2A, 2B, 2C, and 2D may be reduced or increased at a same rate.

Due to the planar shape of the metasurface 130A, the meta pattern layer 130 may have a lens function. In addition, according to the dimensions of each of the meta patterns 2A, 2B, 2C, and 2D, light of a certain wavelength band of a narrow region incident on the metasurface 130A may cause resonance. In other words, when the dimensions of each of the meta patterns 2A, 2B, 2C, and 2D satisfy a resonance condition of light of a certain narrow wavelength band, light of a certain wavelength in the metasurface 130A may resonate. During resonance, a majority portion of the light of a certain wavelength is scattered, and another portion of the light of the certain wavelength may be absorbed in the meta pattern layer 130. Due to such resonance, light of the certain wavelength passing through the meta pattern layer 130 may be substantially blocked or restricted.

The resonance occurring in the meta pattern layer 130 may be represented by Equation 1.

$$\lambda = 557.62 \times h^{0.5642} \quad \text{<Equation 1>}$$

In Equation 1, $\Delta$ (nm) represents a resonance wavelength at the center and h (μm) represents the height of the meta pattern layer 130.

Therefore, when light incident on the meta pattern layer 130 satisfies Equation 1, that is, when the wavelength of light incident on the meta pattern layer 130 corresponds to the resonance wavelength $\lambda$ at the center, transmission blocking resonance may occur in the meta pattern layer 130. "When the wavelength of light corresponds to the resonance wavelength $\lambda$ at the center" may refer not only to a case where the wavelength of light incident on the meta pattern layer 130 is identical to the resonance wavelength $\lambda$ at the center, but also to a case where the wavelength of incident light is adjacent to the resonance wavelength at the center, thus being in a wavelength band (hereinafter referred to as resonance band) that may cause resonance. The resonance wavelength at the center may be a wavelength at the center of the resonance band. In the resonance band, the resonance may become weaker as the distance from the resonance wavelength at the center becomes greater.

As described below, designs of the meta pattern layer 130 may vary according to embodiments. Thus, dimensions (e.g., distance, height, etc.) related to the diameters of the meta patterns 2A, 2B, 2C and 2D included in the meta pattern layer 130 may change. Therefore, the resonance wavelength at the center of Equation 1 may change according to the design of the meta pattern layer 130.

The resonance may include, for example, a Mie resonance or a Fano resonance.

As a result, by adjusting or appropriately selecting the dimension of the plurality of meta patterns 2A, 2B, 2C, and 2D, light component (e.g., wavelength) that passes through the meta pattern layer 130 or light component (e.g., wavelength) that does not pass through the meta pattern layer 130 may be sorted out or selected from light incident on the meta pattern layer 130.

The expressions, "blocking" and "passing" of light may be relative. In an embodiment, although "blocking" may refer to a case where light does not pass 100% through a media, a light component having an intensity that is less than or equal to a predetermined intensity relative to a light component having a maximum intensity, among the light components that passed through the media, may also be regarded as being blocked. "Passing" may refer not only to a case where light passes 100% through a media, but also to a case where the intensity of light that passed through the media is greater than or equal to the determined intensity.

The meta pattern layer 130 may be modified in various ways. In an embodiment, when the meta pattern layer 130 described above is the first meta pattern layer 130, FIG. 4 shows a second meta pattern layer 400. Only parts that are different from those of the first meta pattern layer 130 will be described. Hereinafter, the same applies to descriptions regarding other meta pattern layers.

Figure 4:
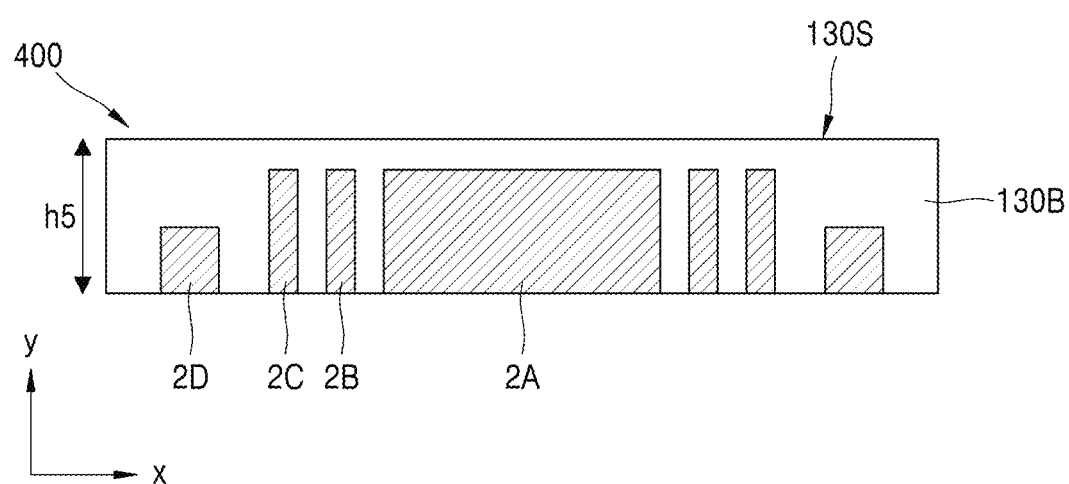
FIGS. 4 to 11 are cross-sectional views and plan views showing various examples of a meta pattern layer according to example embodiments.

Referring to FIG. 4, heights h1 to h4 of the meta patterns 2A, 2B, 2C, and 2D may be smaller than a height h5 of the low refractive index layer 130B. Thus, the low refractive index layer 130B may completely cover the metasurface 130A. The first to fourth meta patterns 2A, 2B, 2C, and 2D may be covered by the low refractive index layer 130B, and the low refractive index layer 130B may fill regions between the first to fourth meta patterns 2A, 2B, 2C, and 2D. Therefore, the heights h1 to h4 of the first to fourth meta patterns 2A, 2B, 2C, and 2D may be smaller than the height h5 of the low refractive index layer 130B, and the upper surface of the first to fourth meta patterns 2A, 2B, 2C, and 2D may be below and separated from an upper surface 130S of the low refractive index layer 130B.

Figure 5:
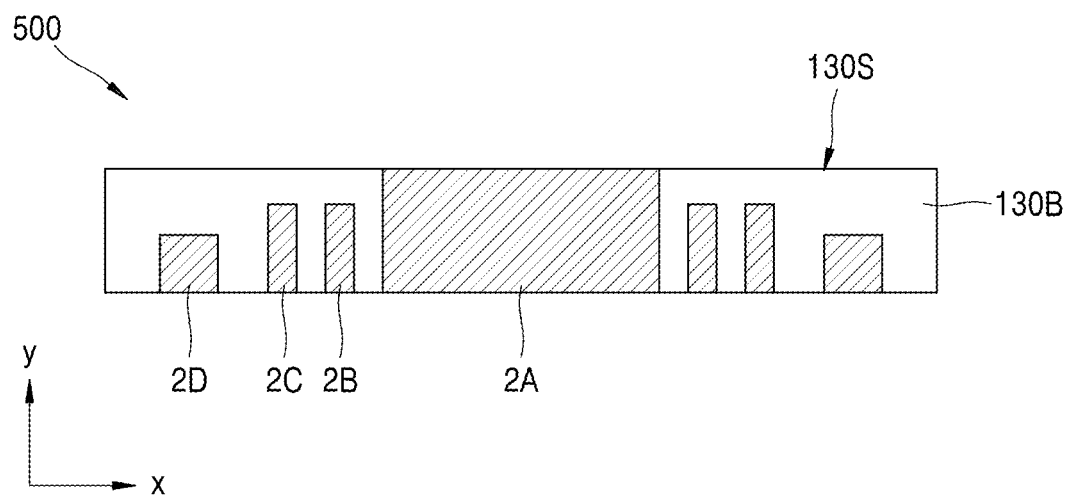

FIG. 5 shows a third meta pattern layer 500 according to an example embodiment.

Referring to FIG. 5, in the third meta pattern layer 500, the heights of the second and third meta patterns 2B and 2C may be smaller than the height of the first meta pattern 2A and greater than the height of the fourth meta pattern 2D. Thus, the heights of the second and third meta patterns 2B and 2C may be between the heights of the first and fourth meta patterns 2A and 2D. Also, the heights of the first meta pattern 2A and the low refractive index layer 130B may be the same, and the heights of the second to fourth meta patterns 2B, 2C, and 2D may be smaller than the height of the low refractive index layer 130B.

Figure 6:
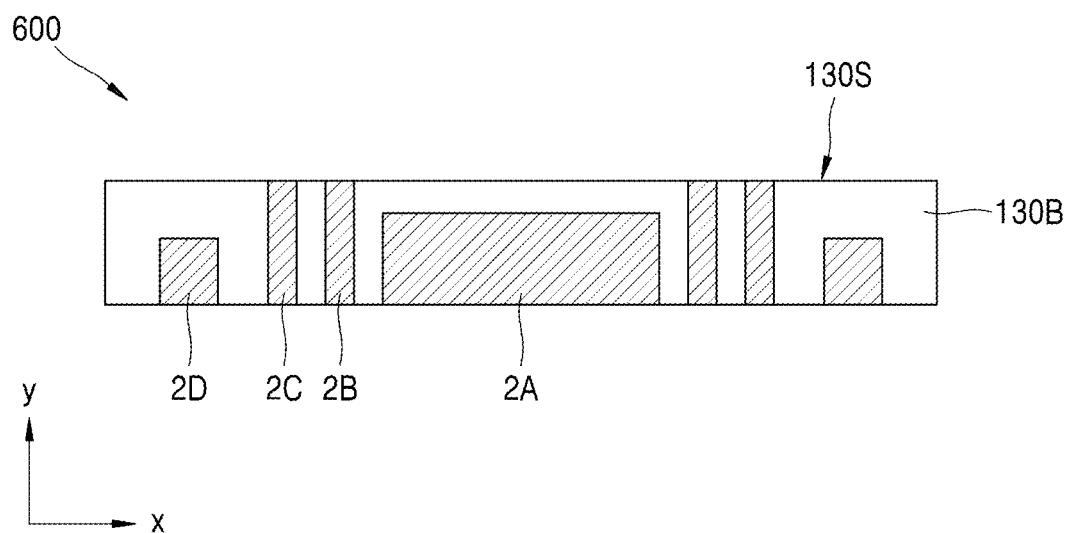

FIG. 6 shows a fourth meta pattern layer 600 according to an example embodiment.

Referring to FIG. 6, in the fourth meta pattern layer 600, the heights of the second and third meta patterns 2B and 2C may be the same as the height of the low refractive index layer 130B. The heights of the first and fourth meta patterns 2A and 2D may be different from each other and may be smaller than the heights of the second and third meta patterns 2B and 2C. The upper surface of the first meta pattern 2A may be lower than and separated from the upper surface of the low refractive index layer 130B. The height of the first meta pattern 2A may be greater than the height of the fourth meta pattern 2D.

Figure 7:
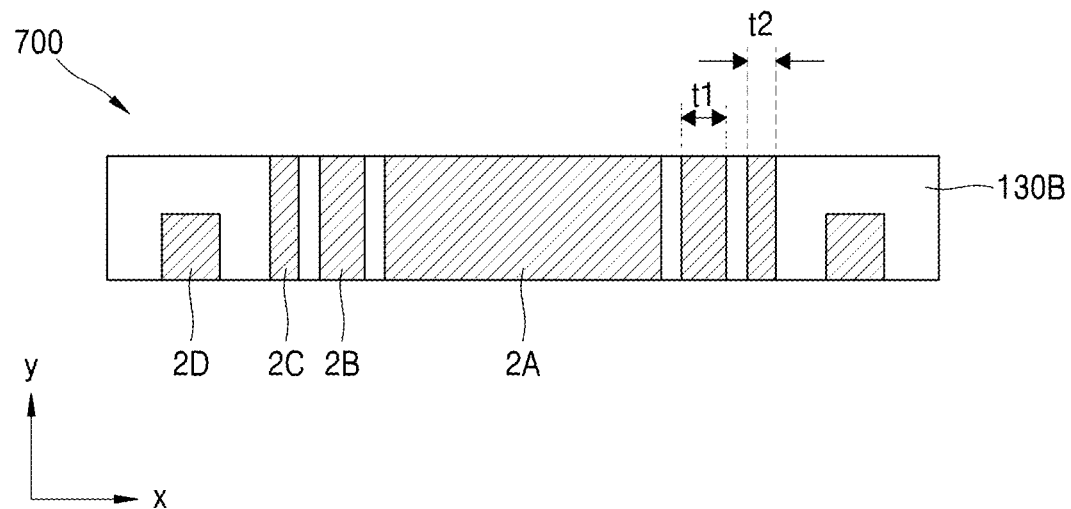

FIG. 7 shows a fifth meta pattern layer 700 according to an example embodiment.

Referring to FIG. 7, in the fifth meta pattern layer 700, thicknesses t1 and t2 in the x-axis direction of the second and third meta patterns 2B and 2C may be different from each other and may be smaller than the thicknesses of the first and fourth meta patterns 2A and 2D. In an embodiment, the thickness t1 of the second meta pattern 2B may be greater than the thickness t2 of the third meta pattern 2C, or vice versa. The thickness t2 of the third meta pattern 2C may be a value between the thickness t1 of the second meta pattern 2B and the thickness of the fourth meta pattern 2D.

Figure 8:
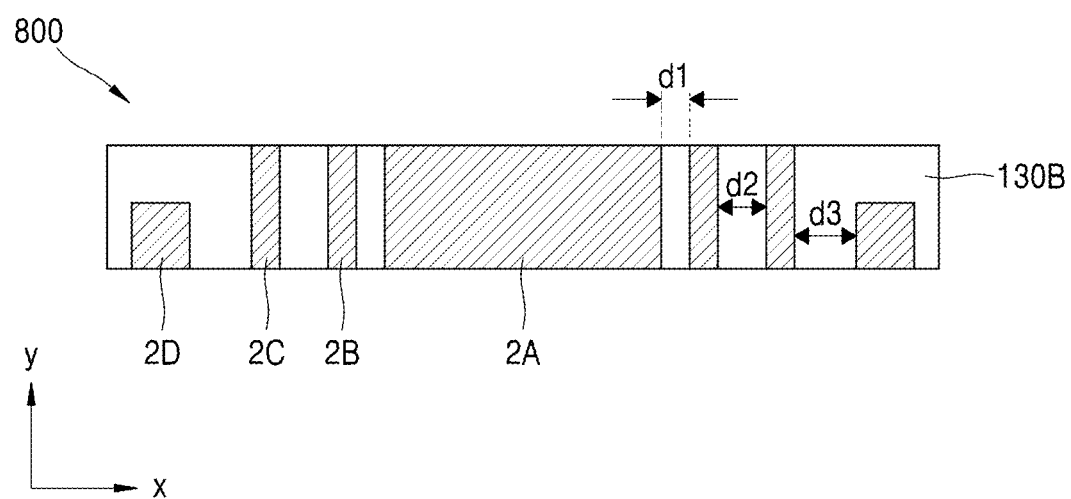

FIG. 8 shows a sixth meta pattern layer 800 according to an example embodiment.

Referring to FIG. 8, in the sixth meta pattern layer 800, distances among the first to fourth meta patterns 2A to 2D may be different from each other. In an embodiment, a first distance d1 between the first meta pattern 2A and the second meta pattern 2B may be less than a second distance d2 between the second meta pattern 2B and the third meta pattern 2C. In an embodiment, the second distance d2 may be less than a third distance d3 between the third meta pattern 2C and the fourth meta pattern 2D. Thus, the distances among the first to fourth meta patterns 2A, 2B, 2C, and 2D may increase in an x-axis direction from the first meta pattern 2A to the fourth meta pattern 2D. However, this is merely an example and the first to fourth meta patterns 2A, 2B, 2C, and 2D may be arranged in an opposite way (that is, the distances may decrease in an x-axis direction from the first meta pattern 2A to the fourth meta pattern 2D).

Figure 9:
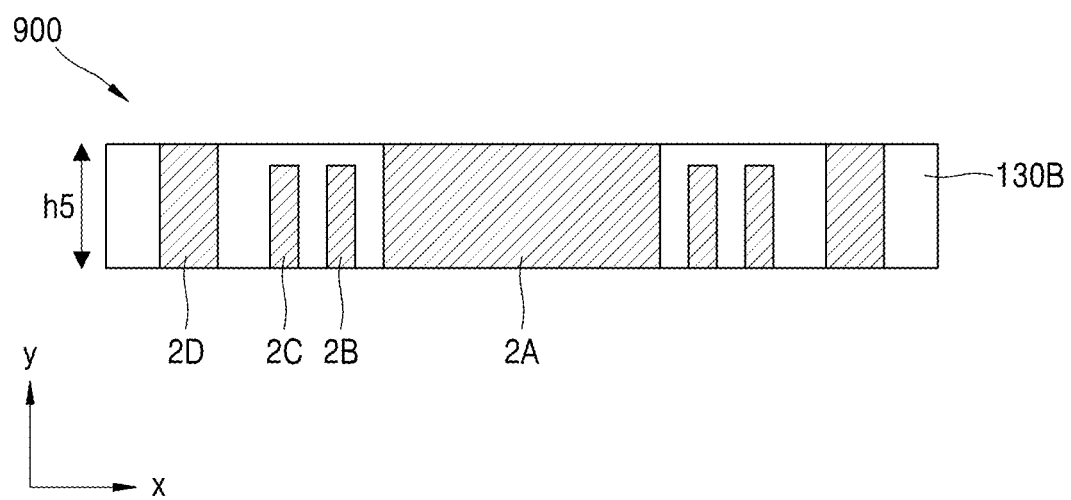

FIG. 9 shows a seventh meta pattern layer 900 according to an example embodiment.

As shown in FIG. 9, in the seventh meta pattern layer 900, heights of the first and fourth meta patterns 2A and 2D may be the same as the height h5 of the low refractive index layer 130B, and the upper surface of the first and fourth meta patterns 2A and 2D may not be covered by the low refractive index layer 130B and be exposed. The heights of the second and third meta patterns 2B and 2C may be less than those of the first and fourth meta patterns 2A and 2D and covered by the low refractive index layer 130B.

Figure 10:
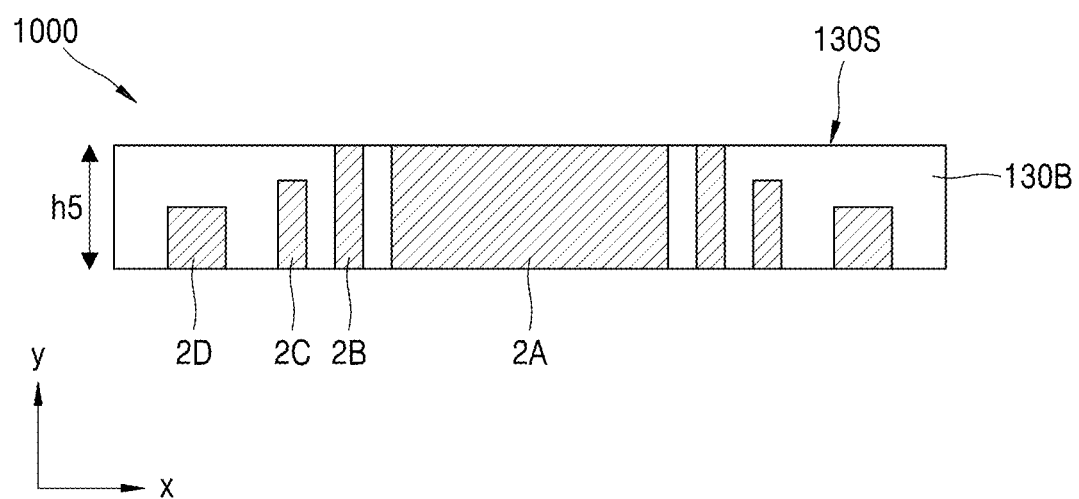

FIG. 10 shows an eighth meta pattern layer 1000 according to an example embodiment.

As shown in FIG. 10, in the eighth meta pattern layer 1000, the heights of the first and second meta patterns 2A and 2B may be the same as a height h5 of the upper surface 130S of the low refractive index layer 130B, and thus, may not be covered by the low refractive index layer 130B and be exposed. The height of the third meta pattern 2C may be less than that of the second meta pattern 2B and greater than that of the fourth meta pattern 2D. The height of the meta patterns may decrease from the second meta pattern 2B to the fourth meta pattern 2D. In other words, the heights of the meta patterns 2B, 2C, and 2D included in the metasurface 130A may decrease from the center to the periphery.

Figure 11:
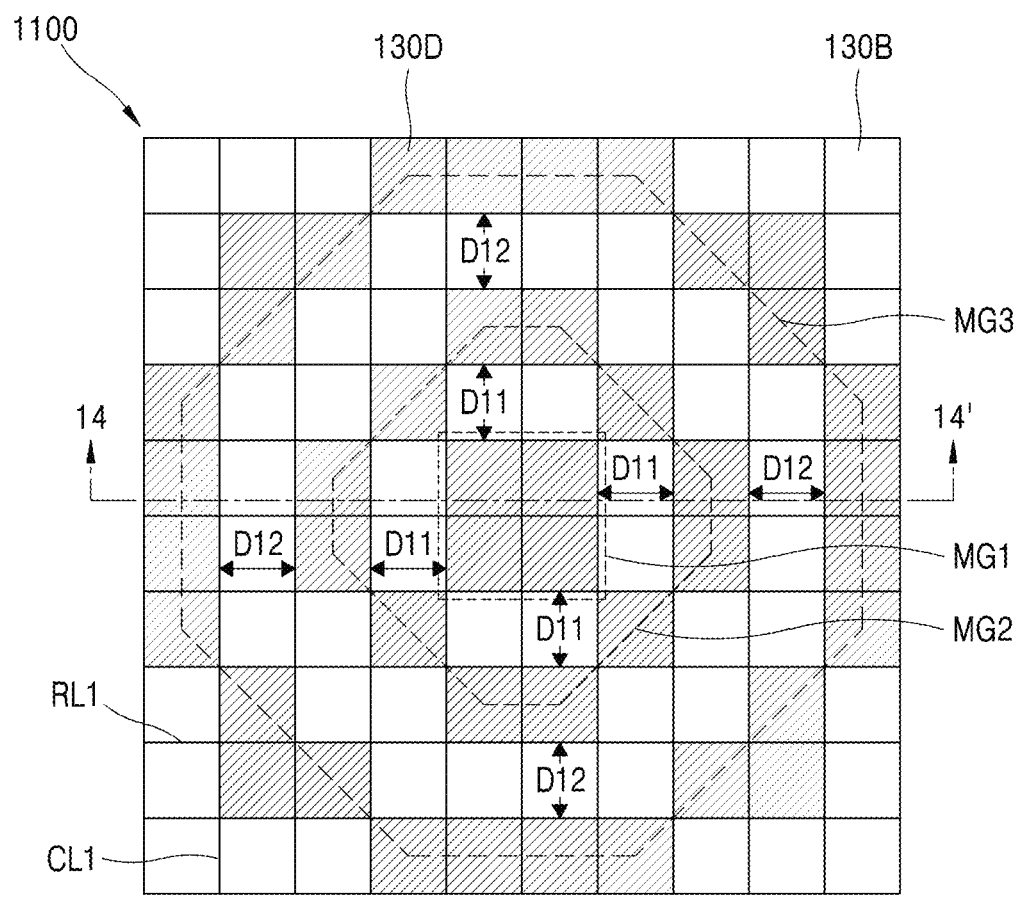

FIG. 11 shows a ninth meta pattern layer 1100 included in an image sensor according to an example embodiment.

Figure 12:
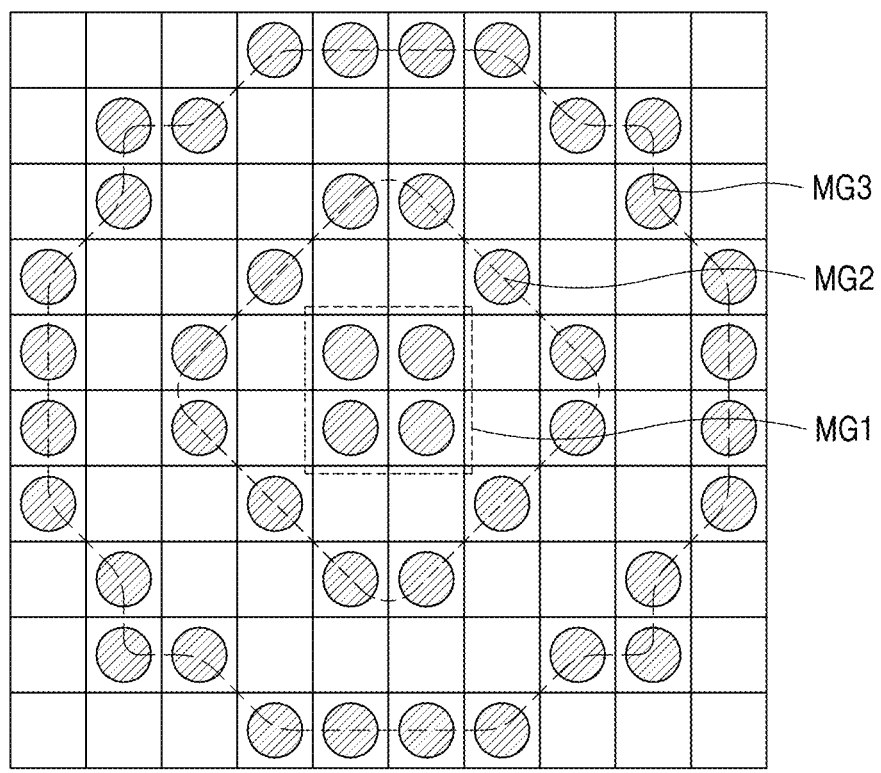
FIG. 12 is a plan view showing an example in which a planar shape of a first unit meta pattern of FIG. 11 is circular.
Figure 13:
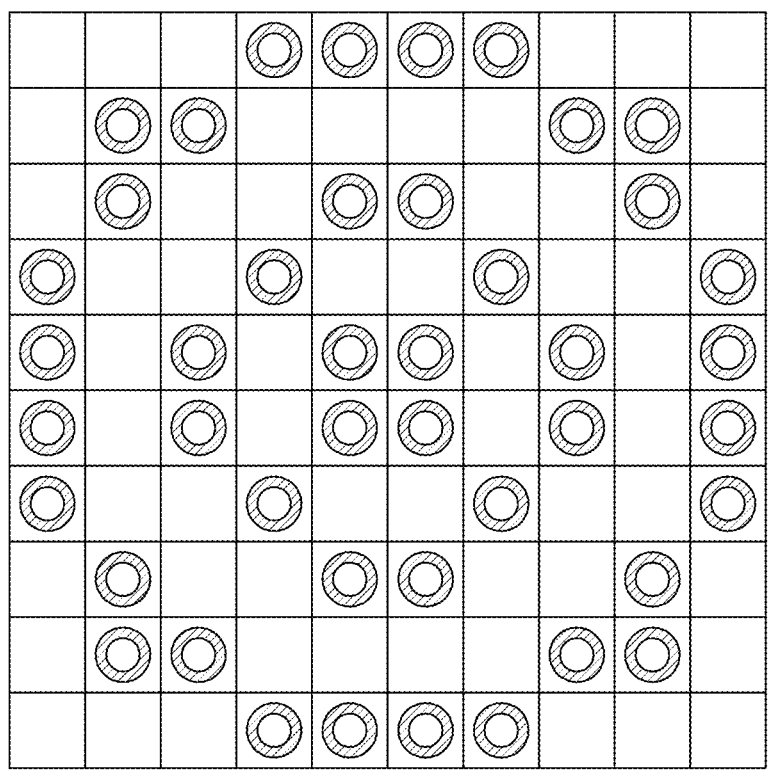
FIG. 13 is a plan view showing an example in which a planar shape of the first unit meta pattern of FIG. 11 is a single-walled cylindrical shape.
Figure 15:
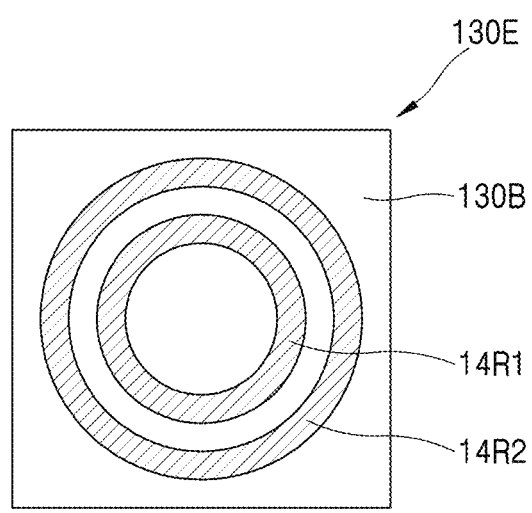
FIG. 15 is a plan view showing second unit meta patterns that may replace first unit meta patterns of FIG. 11.

Referring to FIG. 11, the ninth meta pattern layer 1100 may have an array shape in which a first meta pattern group MG1 is at the center and second and third meta pattern groups MG2 and MG3 are distributed around the first meta pattern group MG1. In an example, the ninth meta pattern layer 1100 may include an array of 10 rows and 10 columns (10*10), but is not limited thereto, and may include an array of 3*3 or any other n*n array (n being an integer greater than 2). Each of the meta pattern groups MG1 to MG3 may include a plurality of first unit meta patterns 130D. The planar shape of one first unit meta pattern 130D may be rectangular and may be in other forms as illustrated in FIGS. 12, 13, and 15, but is not limited thereto. In an example, one first unit meta pattern 130D may be a nanorod. The second and third meta pattern groups MG2 and MG3 may be arranged to sequentially surround the first meta pattern group MG1. In an example, the first meta pattern group MG1 may include four first unit meta patterns 130D, but is not limited thereto, and the first meta pattern group MG1 may include a plurality of first unit meta patterns 130D less than or greater than four. The second meta pattern group MG2 surrounds the first meta pattern group MG1, but a first portion of the plurality of first unit meta patterns 130D included in the second meta pattern group MG2 may contact the first meta pattern group MG1 in a diagonal direction, and a second portion of the plurality of first unit meta patterns 130D included in the second meta pattern group MG2 may be arranged to be separated from the first meta pattern group MG1 by a first distance D11. Regarding the second meta pattern group MG2, the first unit meta patterns 130D may be arranged at a location facing the first meta pattern group MG1 in an x-axis and z-axis direction in the same number as the meta unit patterns 130D of the first meta pattern group MG1. In the second meta pattern group MG2, one first unit meta pattern 130D is arranged in contact with the first meta pattern group MG1 in each diagonal direction of the first meta pattern group MG1. Therefore, when the first meta pattern group MG1 includes four first unit meta patterns, the second meta pattern group MG2 may include twelve first unit meta patterns 130D. The third meta pattern group MG3 may be arranged to completely surround the first and second meta pattern groups MG1 and MG2. The third meta pattern group MG3 may be separated from the second meta pattern group MG2. The first unit meta patterns arranged in the x-axis and z-axis direction among the first unit meta patterns 130D included in the third meta pattern group MG3 may be separated from the first unit meta patterns in the x-axis and z-axis direction of the second meta pattern group MG2 by a second distance D12. The third meta pattern group MG3 may include a total of six first unit meta patterns 130D, three in each direction, for both directions of a first diagonal direction of the first meta pattern group MG1, and may also include six first unit meta patterns 130D for a second diagonal direction perpendicular to the first diagonal direction of the first meta pattern group MG1.

In FIG. 11, row lines RL1 and column lines CL1 are employed to explain array forms of each of meta pattern group, and are not actually included in the meta pattern layer 1100.

Due to the planar shape of the first to third meta pattern groups MG1 to MG3 illustrated in FIG. 11, light passed through the ninth meta pattern layer 1100 may have the same phase profile as when passing through a lens (e.g., a converging lens) or a similar phase profile to the phase profile as when passing through a lens. Thus, the ninth meta pattern layer 1100 may serve as a metalens. Further, by adjusting first and second distances D11 and D12 between the first to third meta pattern groups MG1 to MG3 and/or the shape and dimension, etc. of the first unit meta patterns 130D while maintaining the overall shape of the ninth meta pattern layer 1100, resonance to a certain wavelength of light incident on the ninth meta pattern layer 1100 may occur in the ninth meta pattern layer 1100. Therefore, by setting the dimensions regarding the first to third meta pattern groups MG1 to MG3 to satisfy a resonance condition of a certain wavelength, transmission or blocking of certain components (e.g., cyan, magenta, yellow) among components (e.g., wavelengths) included in light incident on the ninth meta pattern layer 1100 may be determined.

FIG. 12 shows an example in which a planar shape of the first unit meta pattern 130D of FIG. 11 is circular.

FIG. 13 shows an example in which a planar shape of the first unit meta pattern 130D of FIG. 11 is a single-walled cylindrical shape. However, an embodiment is not limited thereto and the planar shape of the first unit meta pattern 130D of FIG. 11 may be a double-walled cylindrical shape.

Figure 14:
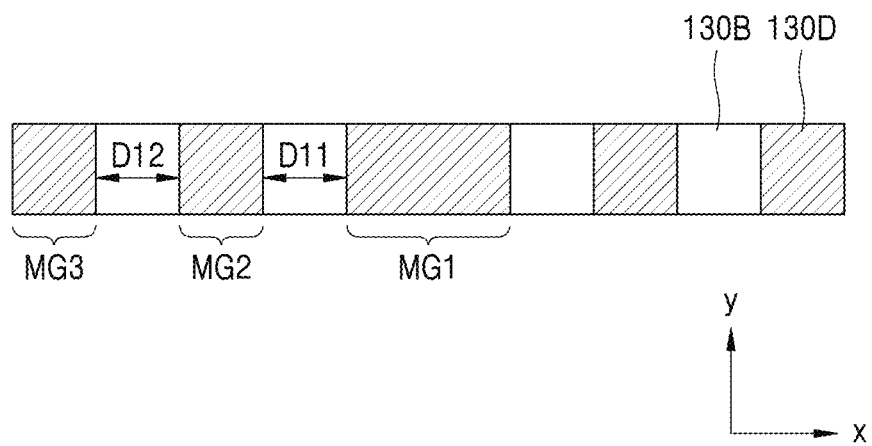
FIG. 14 is a cross-sectional view taken along line 14-14' of FIG. 11.

FIG. 14 shows a cross-sectional view taken along line 14-14' of FIG. 11.

Referring to FIG. 14, the low refractive index layer 130B may fill regions between the first unit meta patterns 130D of the first to third meta pattern groups MG1, MG2, and MG3. In an example, the height of the first unit meta pattern 130D may be the same as the height of the low refractive index layer 130B, but is not limited thereto. In an example, the low refractive index layer 130B may be arranged to completely cover the first unit meta pattern 130D while filling regions between the first unit meta patterns 130D. The first and second meta pattern groups MG1 and MG2 are separated by the first distance D11 in the x-axis direction, and the second and third meta pattern groups MG2 and MG3 are separated by the second distance D12 in the x-axis direction. The first and second distances D11 and D12 may be the same as or different from each other. In an example, the first and second distances D11 and D12 may be less than the wavelength of the incident light. In the first to third meta pattern groups MG1 to MG3, the height of the first unit meta patterns 130D may be the same, but may also differ according to each of the meta pattern groups MG1 to MG3. In an example, the height of the first unit meta patterns 130D included in the first and second meta pattern groups MG1 and MG2 may be different from each other, and the height of the first unit meta patterns 130D included in the second and third meta pattern groups MG2 and MG3 may be the same as each other. In addition, there may be other variety of combinations.

FIG. 15 shows second unit meta patterns 130E that may replace the first unit meta patterns 130D of FIG. 11.

Referring to FIG. 15, the second unit meta pattern 130E may include first and second cylinders 14R1 and 14R2 of a concentric circle. The second cylinder 14R2 is arranged to completely surround the first cylinder 14R1. A diameter and a thickness of the first cylinder 14R1, a distance between the first cylinder 14R1 and the second cylinder 14R2, and a thickness of the second cylinder 14R2 may be adjusted during a manufacturing process.

Figure 16:
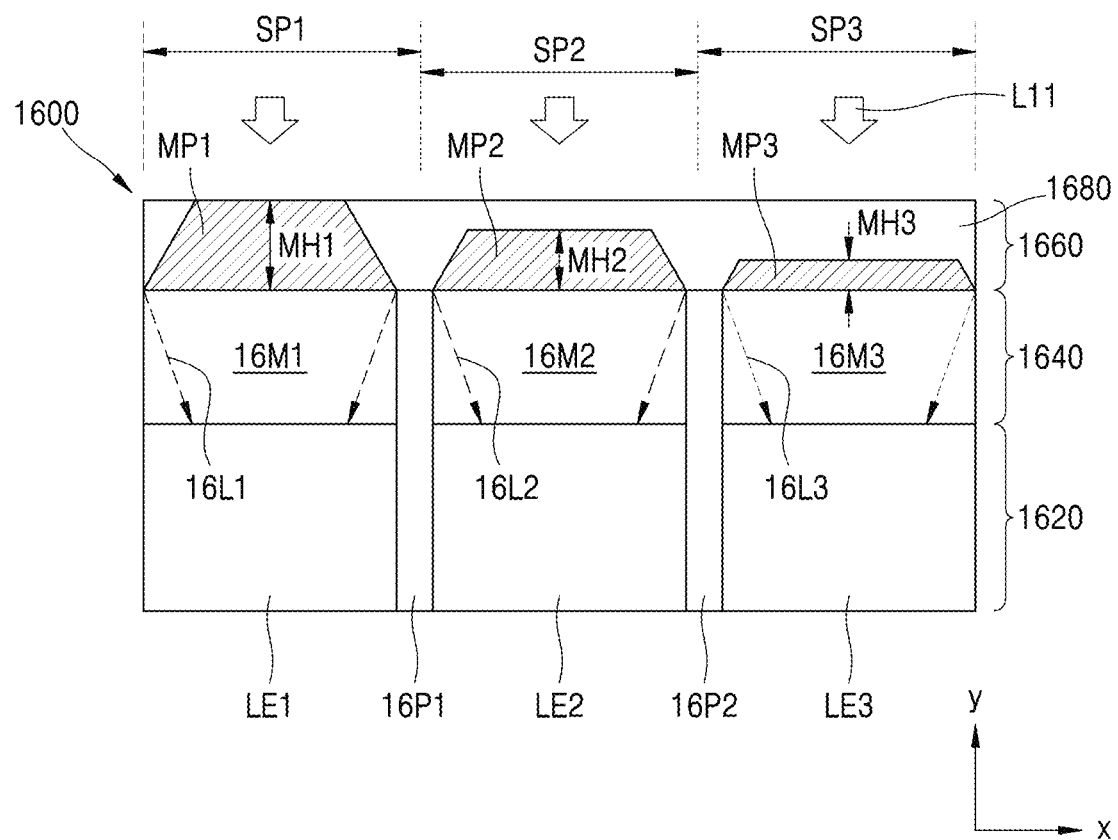
FIG. 16 is a plan view showing an image sensor including a meta pattern layer having a light resonance function, according to an example embodiment.

FIG. 16 shows an image sensor 1600 including a metalens layer having a light resonance function according to an example embodiment. In an example, the image sensor 1600 may include a cyan magenta yellow (CMY) image sensor.

Referring to FIG. 16, the image sensor 1600 may include a photoelectric conversion layer 1620, a transparent interlayer material layer 1640, and a meta pattern layer 1660. The photoelectric conversion layer 1620, the interlayer material layer 1640, and the meta pattern layer 1660 may be sequentially stacked. The photoelectric conversion layer 1620 may include a first photoelectric conversion layer LE1 belonging to a first sub-pixel SP1, a second photoelectric conversion layer LE2 belonging to a second sub-pixel SP2, and a third photoelectric conversion layer LE3 belonging to a third sub-pixel SP3. The interlayer material layer 1640 may include a first transparent material layer 16M1 belonging to the first sub-pixel SP1, a second transparent material layer 16M2 belonging to the second sub-pixel SP2, and a third transparent material layer 16M3 belonging to the third sub-pixel SP3. The meta pattern layer 1660 may include a first meta pattern layer MP1 belonging to the first sub-pixel SP1, a second meta pattern layer MP2 belonging to the second sub-pixel SP2, and a third meta pattern layer MP3 belonging to the third sub-pixel SP3. The meta pattern layer 1660 may include a low refractive index layer 1680 covering a portion of the first to third meta pattern layers MP1, MP2, and MP3. The low refractive index layer 1680 may include the same material as the low refractive index layer 130B described in FIGS. 2 and 3. In the photoelectric conversion layer 1620 and the interlayer material layer 1640, a vertical first separating layer 16P1 is provided between the first and second sub-pixels SP1 and SP2 to prevent interference of light between sub-pixels, and a vertical second separating layer 16P2 is provided between the second and third sub-pixels SP2 and SP3 to prevent interference of light between sub-pixels. In an example, the first to third photoelectric conversion layers LE1, LE2, and LE3 may include the photoelectric conversion layer 110 of FIG. 1. In an example, the first to third transparent material layers 16M1, 16M2, and 16M3 may be the same material layer as each other, and may include the interlayer material layer 120 of FIG. 1. The first to third meta pattern layers MP1, MP2, and MP3 may have first to third heights MH1, MH2, and MH3, respectively. Each of the first to third meta pattern layers MP1, MP2, and MP3 may include the meta pattern layer 130 described in FIGS. 1 to 15. Here, the first meta pattern layer MP1 may include the meta pattern layer 130 configured to have a first resonance characteristic causing resonance at the first wavelength (e.g., cyan), the second meta pattern layer MP2 may include the meta pattern layer 130 configured to have a second resonance characteristic causing resonance at the second wavelength (e.g., magenta), and the third meta pattern layer MP3 may include the meta pattern layer 130 configured to have a third resonance characteristic causing resonance at the third wavelength (e.g., yellow). In an example, the first to third wavelengths may be wavelengths in the visible light region, but are not limited thereto. The first to third resonance characteristics may be different from each other, and to this end, the heights MH1 to MH3 of the first to third meta pattern layers MP1 to MP3 may be different from each other. Because such meta pattern layer 1660 is provided, in the image sensor 1600, light of the first wavelength among incident light L11 may be blocked in the first sub-pixel SP1, light of the second wavelength among incident light L11 may be blocked in the second sub-pixel SP2, and light of the third wavelength among incident light L11 may be blocked in the third sub-pixel SP3. The first to third wavelengths may be different from each other. As a result, each of the sub-pixels SP1 to SP3 may have different transmission spectra from each other. Thus, color filtering may be achieved in each of the sub-pixels SP1 to SP3. Light 16L1 passed through the first meta pattern layer MP1 may be condensed onto the first photoelectric conversion layer LE1 via the first transparent material layer 16M1. Light 16L2 passed through the second meta pattern layer MP2 may be condensed onto the second photoelectric conversion layer LE2 via the second transparent material layer 16M2. Light 16L3 passed through the third meta pattern layer MP3 may be condensed onto the third photoelectric conversion layer LE3 via the third transparent material layer 16M3.

Figure 17A:
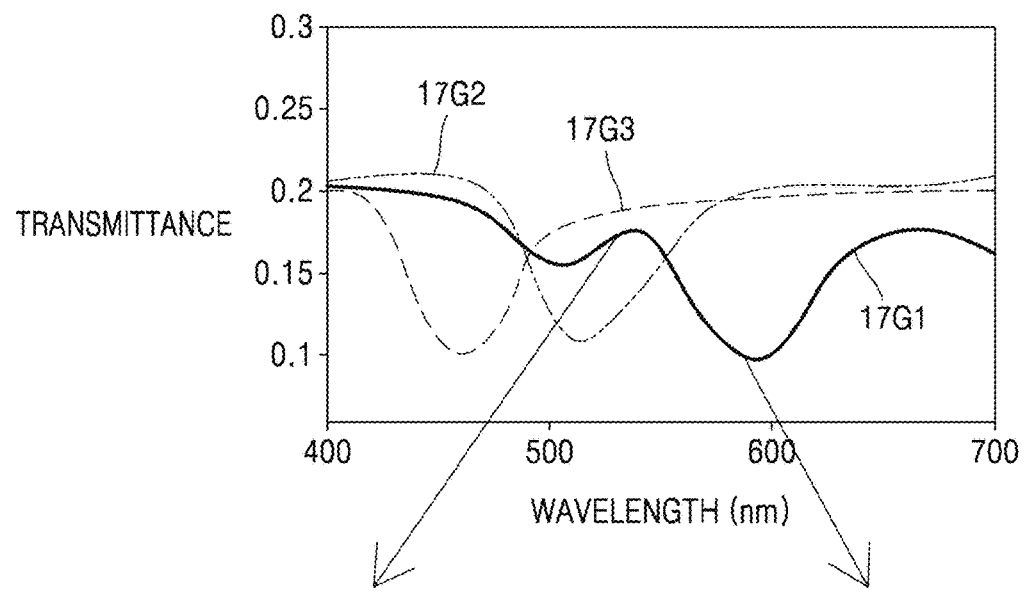
FIGS. 17A, 17B, and 17C show graphs and photos showing simulation results conducted to identify resonance characteristics of an image sensor including a meta pattern layer having a light resonance function according to an example embodiment.
Figure 17B:
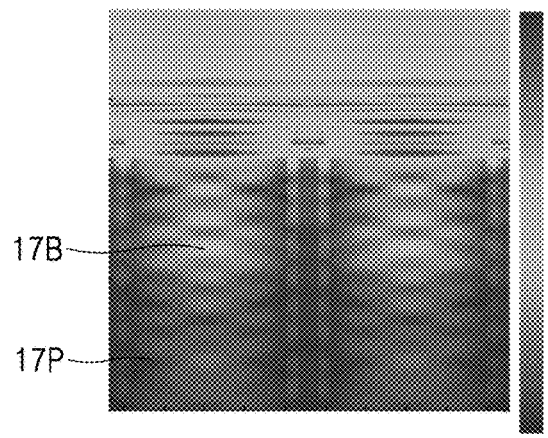
Figure 17C:
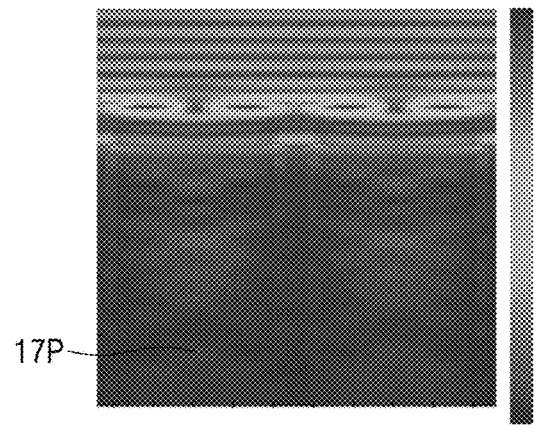

FIGS. 17A, 17B, and 17C show simulation results conducted to identify resonance characteristics of an image sensor including a metalens layer having a resonance function according to an example embodiment.

The image sensor used in the simulation includes a metalens layer designed to have a third height that causes resonance at a wavelength of 600 nm.

FIG. 17A is a graph showing the simulation result. In FIG. 17A, the horizontal axis represents the wavelength, and the vertical axis represents the transmittance. In FIG. 17A, a first graph 17G1 represents an actually measured cyan spectrum, a second graph 17G2 represents a predicted magenta spectrum, and a third graph 17G3 represents a predicted yellow spectrum.

Referring to the first graph 17G1, the transmittance is greatly reduced only at a wavelength of 600 nm. This result is due to the metalens layer designed to cause resonance at 600 nm. From this result, when the metalens layer is designed to have a second height and a first height respectively causing resonance in the middle wavelength band and short wavelength band of visible light, magenta and yellow spectrum may be obtained as illustrated in the second and third graphs 17G2 and 17G3. The height of the metalens layer may be increased in the order of the first height, the second height, and the third height. The first to third graphs 17G1 to 17G3 suggest that when the height of the metalens layer increases, the resonance wavelength also increases.

FIG. 17B shows that when light (e.g., light having a wavelength of 540 nm) in a region where resonance does not occur in the first graph 17G1 of FIG. 17A is incident on the image sensor, light reaches the photoelectric conversion layer (e.g., photodiode) 17P. The light portion 17B of the photoelectric conversion layer 17P represents light reached at the photoelectric conversion layer 17P.

FIG. 17C shows that when light (e.g., light having a wavelength of 600 nm) in a region where resonance occurs in the first graph 17G1 of FIG. 17A is incident on the image sensor, light does not reach the photoelectric conversion layer 17P due to the resonance that occurs at the wavelength of 600 nm.

Figure 18:
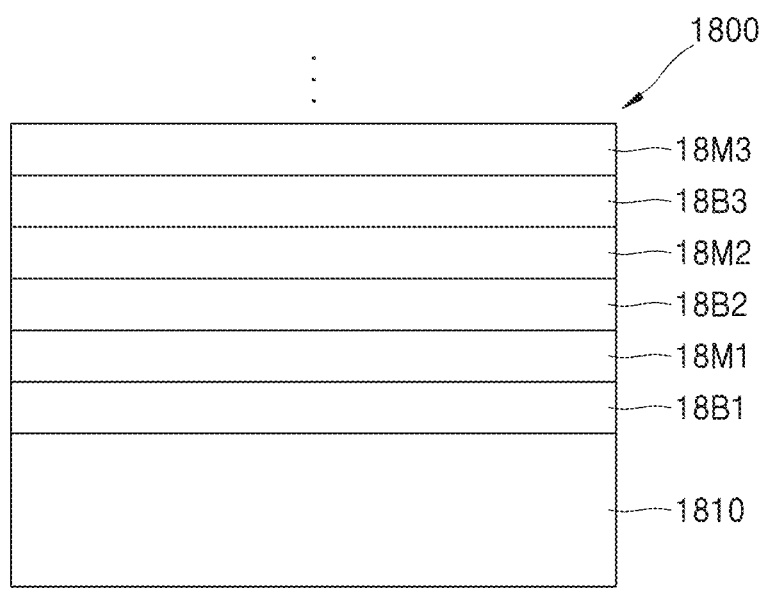
FIG. 18 is a plan view showing an image sensor including a meta pattern layer having a light resonance function according to an example embodiment.

FIG. 18 shows a second image sensor 1800 including a metalens layer having a light resonance function according to an example embodiment. In an example, the second image sensor 1800 may be a hyperspectral image sensor.

Referring to FIG. 18, the second image sensor 1800 may include a photoelectric conversion layer 1810 and a first base layer 18B1, a first meta pattern layer 18M1, a second base layer 18E32, a second meta pattern layer 18M2, a third base layer 18E33, and a third meta pattern layer 18M3 sequentially stacked on the photoelectric conversion layer 1810. A plurality of base layers and a plurality of meta pattern layers may be further provided on the third meta pattern layer 18M3.

The first to third base layers 18B1 to 18B3 may include a transparent material layer that does not absorb or does not substantially absorb incident light. In an example, the first to third base layers 18B1 to 18B3 may be the interlayer material layer 120 of FIG. 1 or may include the interlayer material layer 120. The first to third meta pattern layers 18M1 to 18M3 may each include the meta pattern layer and the metasurface described in any of FIGS. 2 to 15. In this case, each of the meta pattern layers 18M1 to 18M3 may be configured to have different resonance characteristics from each other. In an example, the first meta pattern layer 18M1 may be configured to show a first resonance characteristic causing resonance to light having a first wavelength, the second meta pattern layer 18M2 may be configured to show a second resonance characteristic causing resonance to light having a second wavelength, and the third meta pattern layer 18M3 may be configured to show a third resonance characteristic causing resonance to light having a third wavelength. In an example, the first to third wavelengths may be a wavelength of a red region, a green region, and a blue region, respectively. In an example, the first to third wavelengths may be different wavelengths in any one of the red region, green region, and blue region.

An image sensor according to example embodiments may include a single meta pattern layer that simultaneously performs light collecting and color filtering functions. The metasurface included in the meta pattern layer may be an inorganic material. Therefore, thermal and/or chemical stability problems due to the use of organic materials in color filters of image sensors of the related art may be improved or solved. Further, because one single-layered metasurface replaces a microlens layer and a color filter layer, a unit image sensor may be miniaturized, and as a result, a degree of integration of an image sensor chip may be increased.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
   a photoelectric conversion layer;
   an interlayer material layer on the photoelectric conversion layer; and
   a single meta pattern layer on the interlayer material layer,
   wherein the meta pattern layer comprises a metasurface, the metasurface having a same phase profile as that of a lens,
   wherein the meta pattern layer has a height that causes a resonance at a given wavelength of incident light to block transmission of the given wavelength through the meta pattern layer, and
   wherein the metasurface includes a plurality of meta patterns, and at least two meta patterns of the plurality of meta patterns contact each other in a diagonal direction.

2. The image sensor of claim 1, wherein each of the plurality of meta patterns have a shape of a concentric circle or a shape similar to the concentric circle.

3. The image sensor of claim 2, wherein the plurality of meta patterns have a same height as each other.

4. The image sensor of claim 3, wherein a meta pattern at a center of the plurality of meta patterns has a rectangular planar shape.

5. The image sensor of claim 3, wherein each of the plurality of meta patterns includes a plurality of unit meta patterns.

6. The image sensor of claim 5, wherein, each of the plurality of unit meta patterns is a nanorod and has a circular shape or a non-circular planar shape.

7. The image sensor of claim 6, wherein the nanorod is a single-walled cylinder or a double-walled cylinder.

8. The image sensor of claim 1, wherein the photoelectric conversion layer comprises:
 a first photoelectric conversion layer belonging to a first sub-pixel;
 a second photoelectric conversion layer belonging to a second sub-pixel; and
 a third photoelectric conversion layer belonging to a third sub-pixel.

9. The image sensor of claim 8, wherein the meta pattern layer comprises:
 a first meta pattern layer corresponding to the first photoelectric conversion layer and having a first height that causes the resonance to block transmission of a first wavelength of the incident light;
 a second meta pattern layer corresponding to the second photoelectric conversion layer and having a second height that causes the resonance to block transmission of a second wavelength of the incident light; and
 a third meta pattern layer corresponding to the third photoelectric conversion layer and having a third height that causes the resonance to block transmission of a third wavelength of the incident light.

10. The image sensor of claim 1, wherein the meta pattern layer has a resonance wavelength ($\lambda$) at a center, represented by the following equation:

$$\lambda = 557.62 \times h^{0.5642}$$ ($h$ is the height of the meta pattern layer), and wherein the resonance occurs with respect to the given wavelength corresponding to the resonance wavelength at the center.

11. An image sensor comprising:
 a photoelectric conversion layer;
 an interlayer material layer on the photoelectric conversion layer; and
 a single meta pattern layer on the interlayer material layer,
 wherein the meta pattern layer comprises a metasurface, the metasurface having a same phase profile as that of a lens,
 wherein the meta pattern layer has a height that causes a resonance at a given wavelength of incident light to block transmission of the given wavelength through the meta pattern layer,
 wherein the metasurface includes a plurality of meta patterns, and
 wherein the plurality of meta patterns are respectively arranged in concentric circles, separated from each other, and have different heights from each other.

12. The image sensor of claim 11, wherein a meta pattern at a center of the concentric circles among the plurality of meta patterns is circular and has a height that causes the resonance.

13. The image sensor of claim 11, wherein the heights of the plurality of meta patterns decrease from a center toward an outside of the concentric circles.

14. The image sensor of claim 11, wherein, among the plurality of meta patterns, a height of a meta pattern at a center of the concentric circles is less than a height of an adjacent meta pattern.

15. The image sensor of claim 11, wherein the plurality of meta patterns are arranged such that a height of a meta pattern at a center of the concentric circles and a height of a meta pattern at an outermost side are different from each other.

16. The image sensor of claim 11, wherein the plurality of meta patterns are arranged at distances that cause the resonance at a corresponding wavelength in a radial direction.

17. The image sensor of claim 16, wherein the plurality of meta patterns are arranged such that a distance between a meta pattern located at an outermost side and a meta pattern adjacent thereto is greatest among the distances between the plurality of meta patterns.

18. The image sensor of claim 11, wherein each of the plurality of meta patterns has a thickness that causes the resonance at a corresponding wavelength in a radial direction.

19. The image sensor of claim 18, wherein a meta pattern located at an outermost side has a greatest thickness among the plurality of meta patterns.

20. The image sensor of claim 11, wherein each of the plurality of meta patterns has a thickness that causes the resonance at a corresponding wavelength in a radial direction.

21. An image sensor comprising:
 a photoelectric conversion layer;
 a plurality of base layers that are transparent and sequentially stacked on the photoelectric conversion layer; and
 a plurality of metasurfaces stacked on the photoelectric conversion layer, wherein the plurality of metasurfaces are arranged between the plurality of base layers, respectively,
 wherein the plurality of metasurfaces include a plurality of meta patterns and have a same phase profile as that of a lens,
 wherein the plurality of metasurfaces have dimensions that respectively cause a resonance at a given wavelength of incident light to block transmission of the given wavelength,
 wherein wavelengths that cause the resonance of the plurality of metasurfaces are different from each other, and
 wherein each of the plurality of meta patterns includes a plurality of unit meta patterns.

* * * * *